(12) United States Patent
Doerry et al.

(10) Patent No.: US 6,469,661 B1
(45) Date of Patent: Oct. 22, 2002

(54) CORRECTION OF I/Q CHANNEL ERRORS WITHOUT CALIBRATION

(75) Inventors: Armin W. Doerry, Albuquerque, NM (US); Bertice L. Tise, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 15 days.

(21) Appl. No.: 09/766,322

(22) Filed: Jan. 19, 2001

(51) Int. Cl.[7] .............................. G01S 7/285; H04B 1/10
(52) U.S. Cl. ........................................ 342/194; 375/349
(58) Field of Search ................................ 342/194, 195; 375/349, 340

(56) References Cited

U.S. PATENT DOCUMENTS

| | | | |
|---|---|---|---|
| 3,794,771 A | * 2/1974 | Darboven et al. | 342/199 |
| 3,950,750 A | 4/1976 | Churchill et al. | 343/17.7 |
| 4,003,054 A | * 1/1977 | Goldstone | 342/194 |
| 5,315,620 A | 5/1994 | Halawani et al. | 375/102 |

OTHER PUBLICATIONS

Mitchell, R. L., "Creating Complex Signal Samples from a band-limited real signal", IEEE Transactions on Aerospace and Electronic Systems, vol. 25, Issue 3, pp. 425–427, May 1989.*

Owen, J D., "A comparison of wide bandwidth quadrature demodulators using computer modelling", Radar '97 (Conf. Publ. No. 449) pp. 506–511, Oct. 1997.*

Churchill, Ogar, Thompson; The Correction of I and Q Errors in a Coherent Processor; Jan. 1981, pp. 131–137.

Strereon Limited, web page dowloaded from Ho, Chan, Inkol; A Digital Quadrature Demodulation System; 10/96; pp. 1218–1227.

* cited by examiner

Primary Examiner—Ian J. Lobo
(74) Attorney, Agent, or Firm—George H. Libman

(57) ABSTRACT

A method of providing a balanced demodular output for a signal such as a Doppler radar having an analog pulsed input; includes adding a variable phase shift as a function of time to the input signal, applying the phase shifted input signal to a demodulator; and generating a baseband signal from the input signal. The baseband signal is low-pass filtered and converted to a digital output signal. By removing the variable phase shift from the digital output signal, a complex data output is formed that is representative of the output of a balanced demodulator.

11 Claims, 4 Drawing Sheets

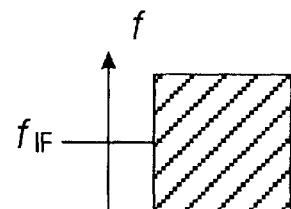
Fig. 4A
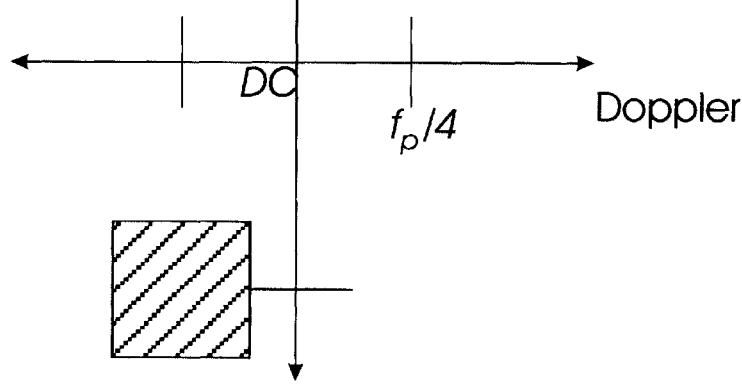
Fig. 4B
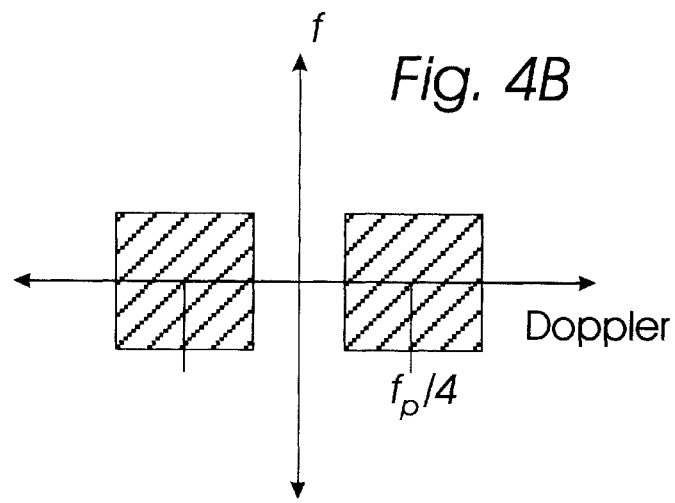
Fig. 4C
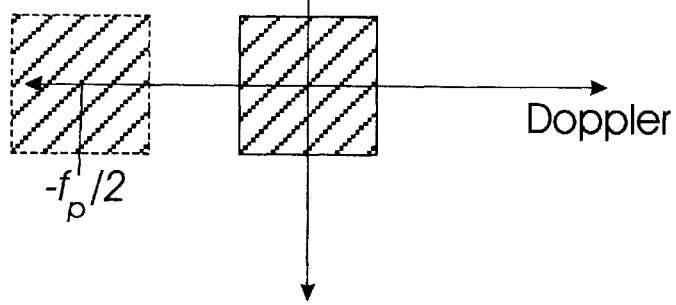

CORRECTION OF I/Q CHANNEL ERRORS WITHOUT CALIBRATION

The United States Government has rights in this invention pursuant to Department of Energy Contract No. DE-AC04-94AL85000 with Sandia Corporation.

CROSS REFERENCE TO RELATED APPLICATIONS (Not Applicable)

BACKGROUND OF THE INVENTION

In modern coherent sensor systems such as radar and sonar, it is advantageous to represent the received signal as complex numbers. Complex signals are conventionally derived by separating real signals into in-phase (I) and quadrature (Q) components; a representation that is conducive to efficient digital signal processing. This technique is known as quadrature demodulation.

Typically, an intermediate frequency (IF) signal is split and mixed with coherent I and Q reference sources given by 2 cos ωt and −2 sin ωt, respectively. After mixing, the products are low pass filtered to retain the difference frequency terms. As a result, the signal is split into I and Q terms which ideally combine to provide a complex output $Y(t)=I(t)+jQ(t)=A(t)\cdot e^{j\Theta(t)}$.

This ideal signal is obtained only if the gains of the I and Q. paths are equal and if the phase difference between channels is 90°. If the ideal signal is not attained, the resulting data is corrupted, ultimately producing ghosts and other undesirable artifacts in a radar image.

Practically, balancing of the I and Q channels is difficult to achieve and maintain, especially considering the wide bandwidths and high frequencies of modern high-performance radar systems. Existing techniques fall into one of two broad categories:

The first category attempts to measure the imbalance, and then correct the data accordingly. These techniques either have a limited capability to mitigate any but the simplest of phase and/or amplitude errors, or they impose a significant processing load on the system. (An imaging radar, such as a synthetic aperture radar (SAR), imposes a tremendous data processing requirement on a system even in the ideal situation. A requirement for additional processing of large SAR signals does not result in rapid image acquisition, and may be prohibitive in many applications.)

F. Churchill et al., "The Correction of I and Q Errors in a Coherent Processor", *IEEE Transactions on Aerospace and Electronic Systems*, Vol. AES-17-1, January 1981, pp. 131–137, discusses one of the first of such techniques. They used a test signal to determine the amount of correction to be applied to the channels. However, such a system is not dynamic in that the system can change as it operates, and this change would only be detected by degrading performance. Otherwise, to prevent this, periodic recalibration periods would need to be incorporated within the normal operation of such a system, resulting in missed data collection opportunities.

Another system using a test signal is discussed by N. Halwani et al., U.S. Pat. No. 5,315,620, which aims to avoid the need for high data sampling rates. The quadrature phase error is detected using a test signal and an error signal is generated. The received I and Q signals are applied to a correction network, along with the error signal, to minimize quadrature phase error between the I and Q signals.

The second category attempts to generate I and Q data using only a single analog to digital converter (ADC). These systems either require excessive video bandwidth (by a factor or two or more), or they suffer a need for excessive power (by a factor of two or more).

K. Ho et al., "A Digital Quadrature Demodulation System", *IEEE Transactions of Aerospace and Electronic Systems*, Vol. 32, No. 4, October 1996, pp. 1218–1227, discloses an I-Q, demodulator based on low pass filtering of the input samples. They show that with a sampling frequency at least equal to 2B, the I components are the decimated input samples with appropriate sign changes and the Q samples are the low pass filter output of a frequency shifted input sequence. A finite impulse response low pass filter minimizes computation. A sampling scheme is also provided that downconverts without IF mixing.

The video-frequency offset technique involves using a single channel to process digital I and Q data in one channel. FIG. 1 shows a prior art system 2 where the received radar signal $X_{IF}(t)=\cos(\omega_{IF}t+\Phi(t))$ is mixed in mixer 4 with a local oscillator signal of $\cos((\omega_{IF}-\pi f_s/2)t)$ down to a frequency $f_s/4$, passed through a low pass filter 5 to limit the signal to IF bandwidth $B_{IF}$, and sampled in analog to digital converter (ADC) 6 at rate $f_s$, where $f_s \geq 2B_{IF}$. The samples are then digitally mixed in mixer 7 to their final form with a digital local oscillator (DLO) signal of $\exp\{-jn\pi/2\}$, which provides a repetitive input to mixer 7 of 1, −j, −1,j.

One problem with this scheme is that it requires $f_s \geq 2B_{IF}$, whereas separate I/Q channels and ADCs require only that $f_s \geq B_{IF}$. (In a typical radar for which this circuit may be used, $B_{IF}$ may range from several MHz to several hundreds of MHz, where an additional factor of two for the ADC sampling frequency might be particularly problematic.) Consequently, this circuit requires more expensive ADCs and accompanying digitial circuits, which may not even be available, or must contend with the performance limits of a lesser IF bandwidth.

FIG. 2A shows the IF signal location in the 2-sided frequency domain at the input of filter 5 for the circuit of FIG. 1. As shown in FIG. 2B, at the output of filter 5, the real-valued signal is symmetric about DC. FIG. 2C shows the output signal after mixing with the DLO. This signal can be digitally filtered and decimated, if desired, to the equivalent of conventional I/Q channel data.

SUMMARY OF THE INVENTION

According to this invention, the spectrums of the desired balanced signals are separated from the error imbalance signals in a manner similar to the second category, but two ADCs are used to avoid the shortcomings denoted above.

To achieve the foregoing and other objects, and in accordance with the purpose of the present invention, as embodied and broadly described herein, the present invention may comprise a method of providing a balanced demodular output comprising providing an analog pulsed input; adding a variable phase shift as a function of time to the input signal, applying the phase shifted input signal to a demodulator; generating a baseband signal from the input signal and low-pass filtering the result; converting the baseband signal to a digital output signal; and removing the variable phase shift from the digital output signal to form a complex data output representative of the output of a balanced demodulator.

Additional objects, advantages, and novel features of the invention will become apparent to those skilled in the art upon examination of the following description or may be learned by practice of the invention. The objects and advantages of the invention may be realized and attained as particularly pointed out in the appended claims.

BRIEF DESCRIPTION OF THE DRAWINGS

The accompanying drawings, which are incorporated in and form part of the specification, illustrate an embodiment of the present invention and, together with the description, serve to explain the principles of the invention.

FIGS. 4A–4C show phase-history plots for the circuit of FIG. 3.

DETAILED DESCRIPTION OF THE INVENTION

Figure 1:
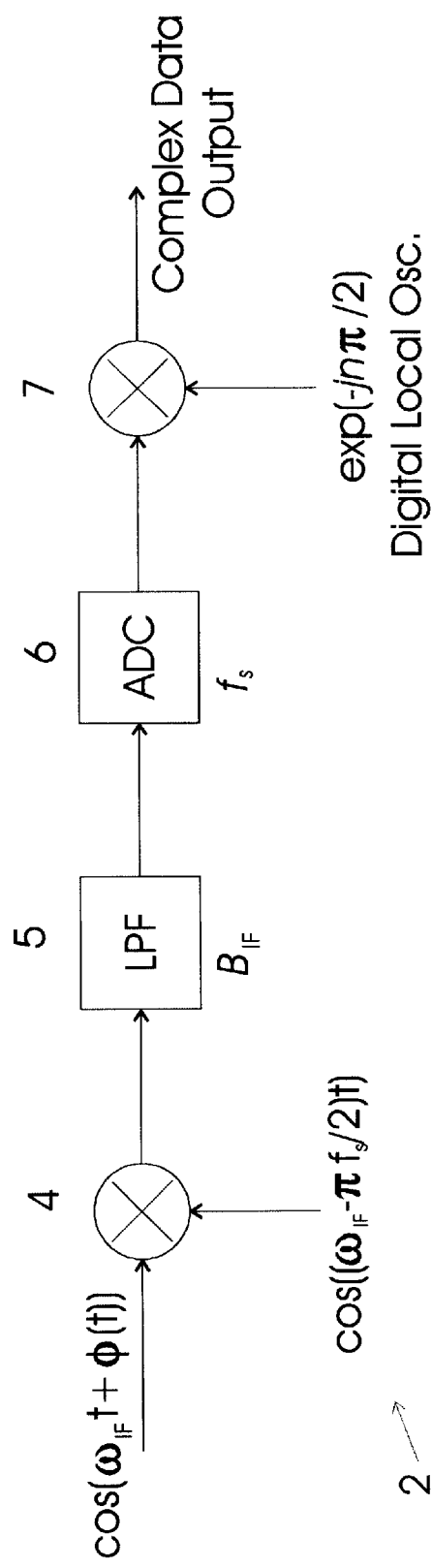
FIG. 1 shows a prior art circuit for video-frequency offset phase-history collection.
Figure 3:
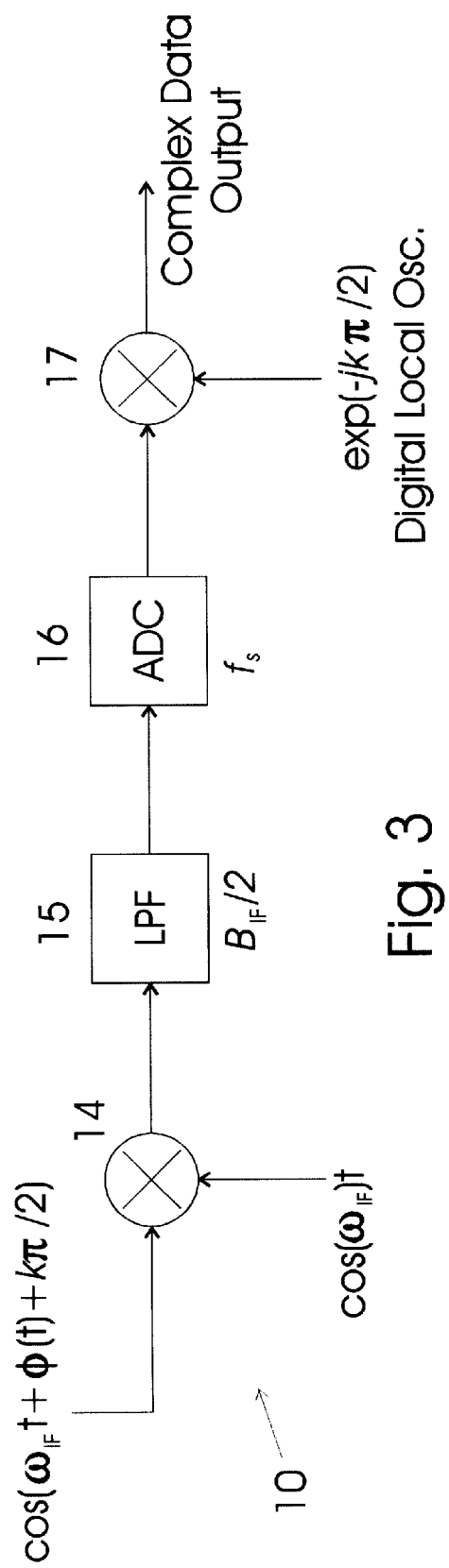
FIG. 3 shows a doppler offset phase-history collection circuit.
Figure 2A:
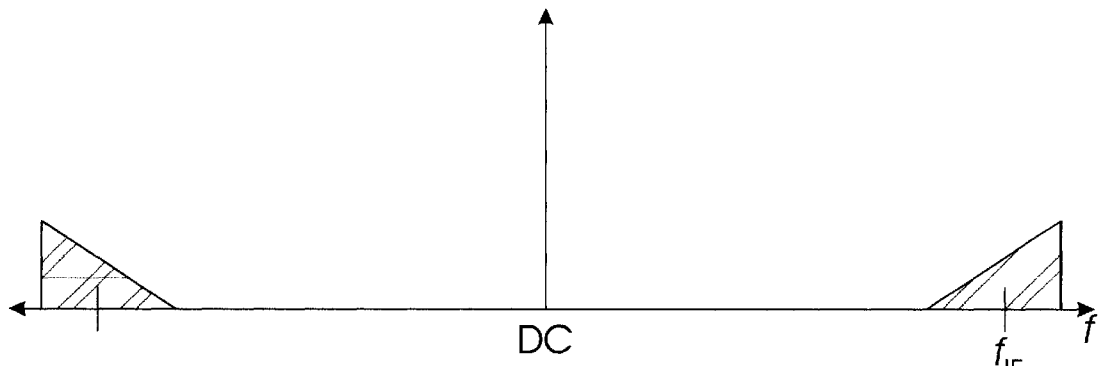
FIGS. 2A–2C show a signal at various locations on the circuit of FIG. 1.
Figure 2B:
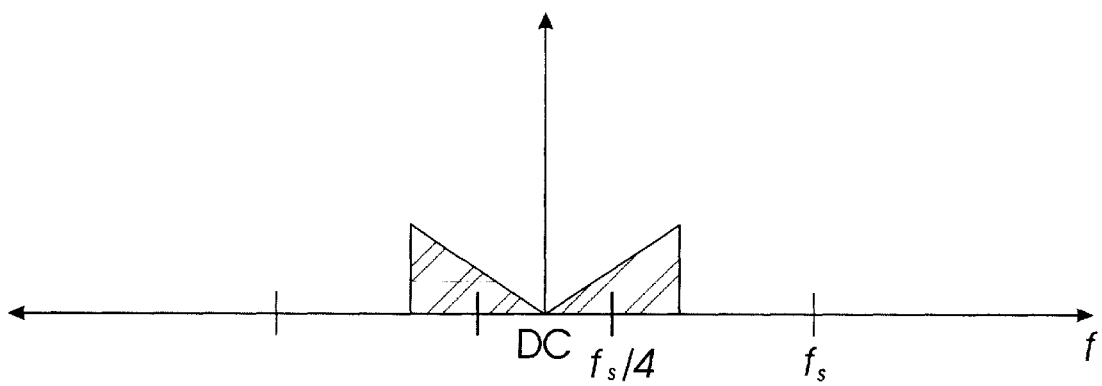
Figure 2C:
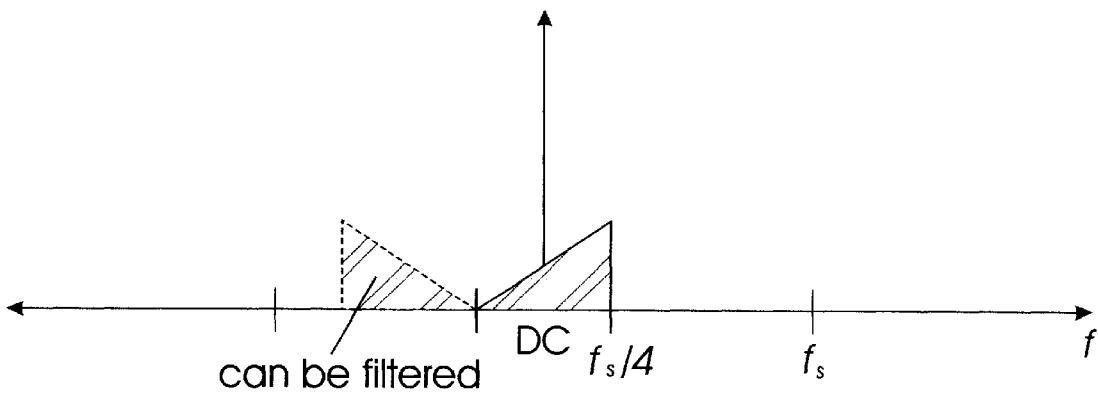

The prior art circuit of FIG. 1 maintained a video-frequency separation between the signal and its image-signal prior to ADC sampling. A similar circuit can be utilized to maintain Doppler frequency separation prior to sampling, as shown in FIG. 3. A Doppler signal is one which may embody a pulse to pulse phase shift. A Doppler frequency spectrum is a collection of such signals.

The operation of this circuit of this invention is based on the determination that if a Doppler frequency spectrum is modified by a pulse to pulse rolling phase shift which is cancelled at the output of the circuit, then the imbalance errors are separated from the input Doppler spectrum, allowing the imbalance errors to be cancelled.

The circuit 10 of FIG. 3 would typically be used to process a Doppler signal of the form $X(t)=\cos[\omega(t)+\Phi(t)]$, where $\Phi(t)$ represents a phase shift that has been applied to the signal, and may vary over time. In a typical radar, $\Phi(t)$ originates with a chirp where each transmitted pulse varies in frequency over a predermitted range in a manner well known in the art, which signal is subsequently received and processed. This signal is typical of the signal received by a modern radar such as a synthetic aperture radar (SAR) and mixed down to intermediate frequency $\omega_{IF}$ in a manner well known to those of ordinary skill in the art. In a typical prior art system, this signal would be processed in a syncronous quadrature demodulator to yield I/Q outputs, which outputs would be as accurate as the balance between channels in the demodulator, as discussed above.

In accordance with a first embodiment of this invention, the IF input signal of FIG. 3 also includes a pulse-to-pulse rolling phase shift of $jk\pi/2$ radians, so the input signal to mixer 14 is $X_{IF}(t,k)=\cos(\omega_{IF}t+\Phi(t,k)+k\pi/2)$, where k is the pulse index (an integer that is incremented by 1 with each pulse) and the pulses occur at a frequency $f_p$, the frequency at which the signal pulses were transmitted. Doppler frequency, for practical purposes, is the pulse-to-pulse phase change, and hence can be modeled as the derivative of the phase with respect to k. For each four counts of k, the input function is incremented by a phase shift of 0, 90°, 180°, and 270°. On the fifth count, the phase shift is back to 0.

This rolling phase shift is easily generated by a direct digital synthesizer such as disclosed in copending Ser. No. 09/238,762, filed Jan. 28, 1999, by Peter Dudley and Bertice Tise, still pending and assigned to the assignee of this invention. This phase shift may be applied to the transmitted pulse, or to any of the local oscillators that are conventionally mixed with the received signal to bring it down to the intermediate frequency that is input into the demodulator of FIG. 3.

After being mixed with $\cos(\omega_{IF}t)$ at mixer 14 and fed through low pass filter 15 (with a cutoff of $B_{IF}/2$), the signal of FIG. 3 may be described as:

$$X_{LPF}(t,k)=\tfrac{1}{2}(\exp\{j\Phi(t,k)\}\exp\{jk\pi/2\}+\exp\{-j\Phi(t,k)\}\exp\{-jk\pi/2\}).$$

The positive video-frequencies have a positive Doppler shift, but the negative video-frequencies have a negative Doppler shift. This signal can be sampled at the reduced rate of $f_s \geq B_{IF}$.

FIGS. 4A–4C shows the signal spectrums from the circuit of FIG. 3 in the 2-Dimensional phase-history plane, where the horizontal axis shows Doppler frequency and the vertical axis shows carrier frequency. In FIG. 4A, the signal at the input to the mixer 14 is centered at $f_{IF}$ and the Doppler is centered at $f_p/4$. FIG. 4B shows the signal at baseband after passing through LPF 15, and FIG. 4C shows that the desired signal has been shifted to the center point by the digital Doppler shift from mixer 17, while the undesired image shifted to $-f_p/2$ can be removed by digital filtering of the data, or as part of a typically subsequent transform via digital filtering of the data after the digital Doppler shift.

Analysis of the circuit of FIG. 3 shows that the digital Doppler shift is accomplished by pulse-to-pulse multiplication with the sequence $\exp\{-jk\pi/2\}=1,-j,-1, j, \ldots$ This signal is the complement of the phase shift that was applied to the input signal to the circuit 10 of FIG. 3, and serves to cancel, on a pulse-by-pulse basis, the input phase shift. That is, an input pulse that was shifted 90° is shifted by $-j$ at the output; an input pulse that was shifted 180° is shifted by $-1$, and an input pulse that was shifted 270° is shifted by $+j$. It also implies that every other radar pulse is purely I-channel with the in-between pulses being purely Q-channel. The single ADC alternates between I and Q on a pulse-to-pulse basis. For each of the I- and Q-channel pulse trains, every other pulse has its data negated, which is easily compensated for with programmable logic or other digital circuitry.

Whereas the circuit of FIG. 1 requires twice the ADC sampling frequency to maintain separation of the desired spectral region from its image, the circuit of FIG. 3 requires twice the pulse rate frequency (or azimuth sampling rate) to maintain separation. That is, the PRF must satisfy $f_p \geq 2B_{Doppler}$, the Doppler bandwidth of the IF signal. However, the ADC sampling frequency, $f_s$, is half that required for the other circuit.

The Doppler offset technique requires two pulses to gather data to make an I/Q data pair, whereas the video-frequency offset technique requires only one pulse; therefore, the Doppler technique has a 3 dB signal-noise-ratio disadvantage compared to the video technique.

Figure 5:
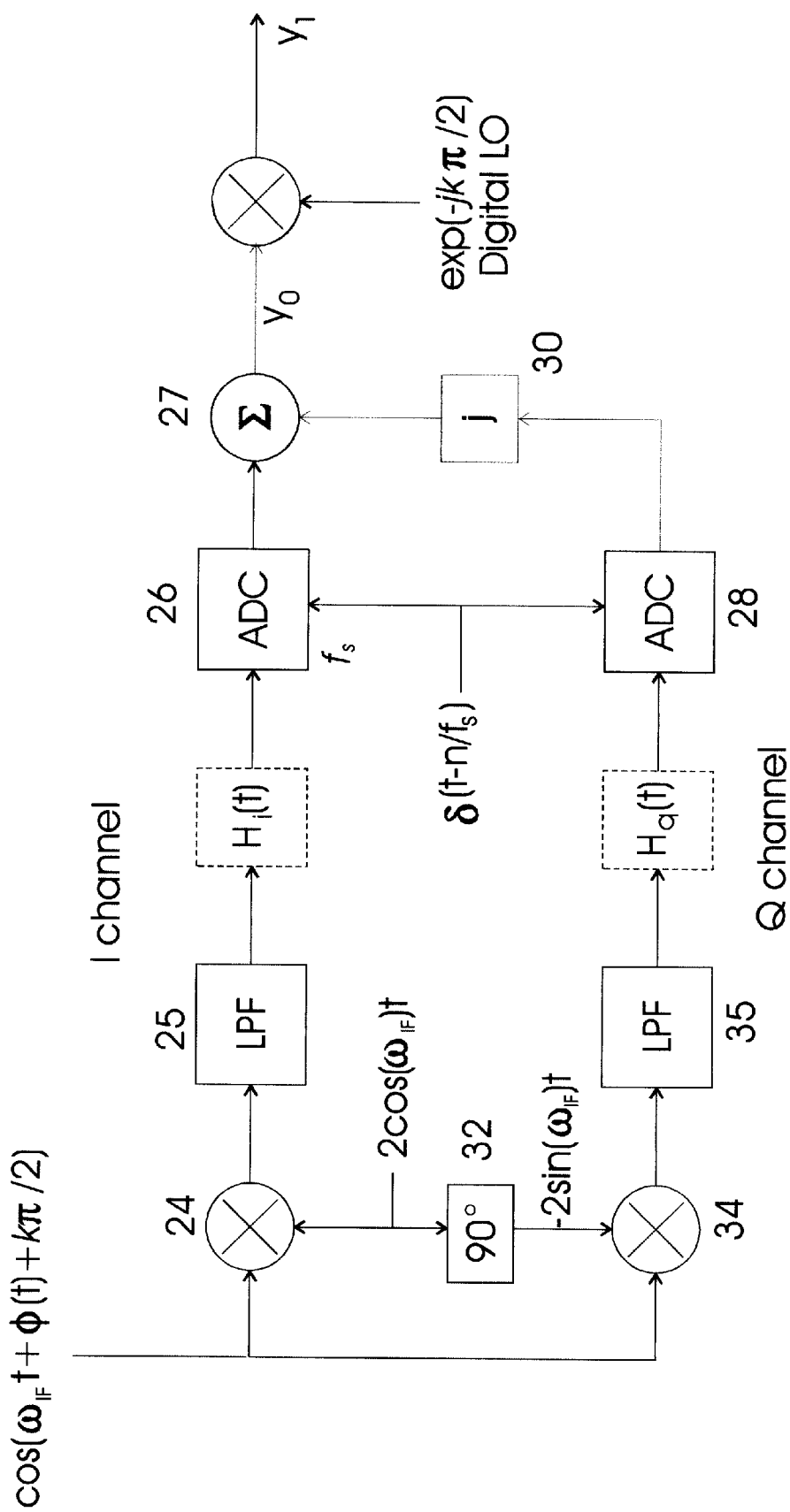
FIG. 5 shows a phase modulated I/Q demodulator of the invention.

Both of these techniques also offer unwanted spectral components centered at their respective fold-over frequencies. With enough separation they can be filtered, after which the data can be decimated into their respective dimensions. FIG. 5 shows another embodiment of this invention that uses the same input signal, $X_{IF}(t,k)=\cos(\omega_{IF}t+\Phi(t,k)+k\pi/2)$, to the quadrature demodulator as the embodiment of FIG. 3, discussed previously.

This signal is input to each of mixers 24, 34 where the I/Q channels are formed. In particular, $X_{IF}(t,k)$ is mixed with $2\cos(\omega_{IF}t)$ in mixer 24 and with $-2\sin(\omega_{IF}t)$ (the result of shifting $2\cos(\omega_{IF}t)$ by 90° in phase shifter 32) in mixer 34.

These components are standard RF hardware, and quadrature mixers comprising the phase shifter 32 and mixers 24 and 34 are commonly available in a single package.

After passing through low pass filters 25, 35 with a cutoff of $B_{IF}/2$ to remove unwanted mixing products, the signal at point $i_1$ is described by $X_{i_1}(t,k)=\cos(\Phi(t,k)+k\pi/2)$ and the signal at point $q_i$ is described by $X_{q_1}(t,k)=\sin(\Phi(t,k)+k\pi/2)$. These are perfect signals; i.e., the signals that would be present if no imbalance exists.

Since, in reality, even the best systems have some imbalance, these will be modeled by a transfer function $H_i(t)$ in the I channel and a function $H_q(t)$ in the Q channel. For the purpose of analysis, the imbalances are split between these transfer functions such that at the respective outputs of these transfer functions, the signals take on the form:

$$X_{i_2}(t, k) = (1 + a_\varepsilon)\cos\left(\Phi(t, k) + \frac{k\pi}{2} + \theta_\varepsilon\right),$$

and $$X_{q_2}(t, k) = (1 - a_\varepsilon)\sin\left(\Phi(t, k) + \frac{k\pi}{2} - \theta_\varepsilon\right),$$

where the error terms $a_\varepsilon$ and $\theta_\varepsilon$ are typically small and video-frequency dependent.

Each of these analog signals is now converted to a digital form by one of A/D converters 26 and 28 in a manner well known in this art. Each of ADC 26, 28 is sampled in a conventional fashion with a sampling function, taking samples at times described by $$\delta\left(t - \frac{n}{f_s}\right),$$

where n is a fast-time sample number and $f_s$ is the sample frequency. The digital output of ADC 28 is at this point merely data and is declared the imaginary component, thereby effectively causing it to be shifted 90° as represented by block 30. The outputs of ADCs 26, 28 are appropriately added, and the sampled signal at point $y_0$ is:

$$Y_0(n, k) = \begin{bmatrix} (1 + a_\varepsilon)\cos\left(\Phi(n, k) + \frac{k\pi}{2} + \theta_\varepsilon\right) + \\ j(1 - a_\varepsilon)\sin\left(\Phi(n, k) + \frac{k\pi}{2} - \theta_\varepsilon\right) \end{bmatrix},$$

which equation may be manipulated to $$Y_0(n, k) = \begin{bmatrix} \cos\left(\Phi(n, k) + \frac{k\pi}{2}\right)\cos\theta_\varepsilon + j\sin\left(\Phi(n, k) + \frac{k\pi}{2}\right)\cos\theta_\varepsilon - \\ \sin\left(\Phi(n, k) + \frac{k\pi}{2}\right)\sin\theta_\varepsilon - j\cos\left(\Phi(n, k) + \frac{k\pi}{2}\right)\sin\theta_\varepsilon + \\ a_\varepsilon\cos\left(\Phi(n, k) + \frac{k\pi}{2}\right)\cos\theta_\varepsilon - ja_\varepsilon\sin\left(\Phi(n, k) + \frac{k\pi}{2}\right)\cos\theta_\varepsilon - \\ a_\varepsilon\sin\left(\Phi(n, k) + \frac{k\pi}{2}\right)\sin\theta_\varepsilon - ja_\varepsilon\cos\left(\Phi(n, k) + \frac{k\pi}{2}\right)\sin\theta_\varepsilon \end{bmatrix},$$

which yields $$Y_0(n, k) = \begin{bmatrix} \cos\theta_\varepsilon\exp\{j\Phi(n, k)\}\exp\left\{j\frac{k\pi}{2}\right\} - \\ \sin\theta_\varepsilon\exp\left\{-j(\Phi(n, k) - \frac{\pi}{2})\right\}\exp\left\{-j\frac{k\pi}{2}\right\} + \\ a_\varepsilon\cos\theta_\varepsilon\exp\{-j\Phi(n, k)\}\exp\left\{-j\frac{k\pi}{2}\right\} + \\ a_\varepsilon\sin\theta_\varepsilon\exp\left\{j(\Phi(n, k) + \frac{\pi}{2})\right\}\exp\left\{j\frac{k\pi}{2}\right\} \end{bmatrix}.$$

For small error terms, this last equation may be approximated as $$Y_0(n, k) = \begin{bmatrix} \exp\{j\Phi(n, k)\} - \\ \sin\theta_\varepsilon\exp\left\{-j(\Phi(n, k) - \frac{\pi}{2})\right\}\exp\{-jk\pi\} + \\ a_\varepsilon\exp\{-j\Phi(n, k)\}\exp\{-jk\pi\} \end{bmatrix}\exp\left\{jk\frac{\pi}{2}\right\}.$$

This signal is fed through mixer 27 for modulation by a complementary signal, i.e., a pulse-dependant corrective signal with opposite phase than that was applied to $X_{IF}$. This constitutes a digital Doppler shift, yielding:

$$Y_1(n, k) = \begin{bmatrix} \exp\{j\Phi(n, k)\} - \\ \sin\theta_\varepsilon\exp\left\{-j(\Phi(n, k) - \frac{\pi}{2})\right\}\exp\{-jk\pi\} + \\ a_\varepsilon\exp\{-j\Phi(n, k)\}\exp\{-jk\pi\} \end{bmatrix}$$

The term $\exp\{j\Phi(n,k)\}$ is the desired 'error-free' term, while the $2^{nd}$ and $3^{rd}$ are the result of I/Q imbalance. If these terms are removed, the I and Q channels are 'balanced.'

Since each of lines 2 and 3 in the equation for $Y_1$ are modulated by $\exp\{-jk\pi\}$, these error terms are centered at Doppler frequency $f_p/2$, as were the unwanted spectral components for Doppler offset phase-history collection of FIGS. 3 and 4. Therefore, for a large enough pulse rate frequency $f_p \geq 2B_{Doppler}$), the 'imbalance' is separated in Doppler frequency from the desired signal, and can therefore be filtered.

Unlike the previous embodiment, each radar pulse contributes both I-channel and Q-channel data. Consequently; there is no 3 dB SNR penalty as there was in the circuit of FIG. 3. In addition, ADC sampling frequency must satisfy $f_s \geq B_{IF}$, only half the value needed in the video frequency embodiment of FIG. 1.

The mixing operation to provide the complementary output phase shift and thereby remove the rolling phase shift in the data comprises multiplication of appropriate values from 1,-j,-1,j, and may be accomplished by appropriately trading of, and sign changes to, the initially generated I and Q data. One of ordinary skill in the art will appreciate that this phase shift may be implemented in the ADC board or elsewhere.

The particular sizes and equipment discussed above are cited merely to illustrate a particular embodiment of this invention. It is contemplated that the use of the invention may involve components having different sizes and shapes as long as the principle, that applying controlled phase shifts to the signal prior to I/Q demodulation, followed by corresponding removal of the phase shifts in the data after the ADCs, in an effort to separate in Doppler the balanced signals from imbalance errors between the I and Q channels, is followed. For example, other phase shift functions besides the particular rolling phase shift discussed might be employed to the same advantage, as long as the input phase shift has enough variation in phase to cause the system to operate, and the output phase shift mirrors and cancels the input phase shift. And while the input signal, $X_{IF}$, is denoted as an intermediate frequency signal of a digital radar receiver, the invention is applicable to any pulsed signal that may be derived as a summation of sinusoids. Furthermore, one of ordinary skill in the art recognizes that this technique is 'linear', that is, the property of superposition holds for input signals and output signals. Consequently, a scaled input signal would yield a like scaled output signal, and a sum of input signals would yield an output signal that is the sum of output signals if the inputs were applied individually. It is intended that the scope of the invention be defined by the claims appended hereto.

What is claimed is:

1. A method of providing a balanced demodular output comprising:

providing an analog pulsed input;

adding a variable phase shift as a function of time to the input signal, applying the phase shifted input signal to a demodulator;

generating a baseband signal from the input signal and low-pass filtering the result;

converting the baseband signal to a digital output signal; and removing the variable phase shift from the digital output signal to form a complex data output representative of the output of a balanced demodulator.

2. The method of claim 1 wherein the analog pulsed input has a pulse repetition rate $f_p$.

3. The method of claim 2 wherein the variable phase shift changes only over a range of discrete values.

4. The method of claim 3 wherein the variable phase shift changes with each pulse.

5. The method of claim 4 wherein the variable phase shifts by 90° with each change.

6. The method of claim 3 wherein removing the variable phase shift comprises mixing the digital output signal with a digital local oscillator signal having a variable phase that is complementary to the variable phase shift on the input signal.

7. The method of claim 6 wherein the variable phase shifts by 90° with each change and the digital local oscillator signal shifts by $-j$ with each change.

8. The method of claim 2 wherein the demodulator has a single channel and a single analog-digital converter for converting the baseband signal to the digital output signal.

9. The method of claim 2 wherein the demodulator has parallel I and Q channels, each channel having an analog-digital converter having a digital output, these digital outputs being combined to form the digital output signal.

10. The method of claim 9 wherein $f_p \geq 2B_{Doppler}$, where $B_{Doppler}$ is the Doppler bandwidth of the signal.

11. The method of claim 10 further comprising band pass filtering the digital output.

* * * * *